(12) United States Patent
Basker et al.

(10) Patent No.: US 8,637,931 B2
(45) Date of Patent: Jan. 28, 2014

(54) FINFET WITH MERGED FINS AND VERTICAL SILICIDE

(75) Inventors: Veeraraghavan S. Basker, Schenectady, NY (US); Andres Bryant, Burlington, VT (US); Huiming Bu, Milwood, NY (US); Wilfried Haensch, Somers, NY (US); Effendi Leobandung, Wappingers Falls, NY (US); Chung-Hsun Lin, White Plains, NY (US); Theodorus E. Standaert, Pine Bush, NY (US); Tenko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/337,874

(22) Filed: Dec. 27, 2011

(65) Prior Publication Data
US 2013/0161744 A1 Jun. 27, 2013

(51) Int. Cl.
*H01L 27/12* (2006.01)
(52) U.S. Cl.
USPC ...... 257/347; 257/350; 257/393; 257/E21.06; 257/E21.09; 257/E21.111
(58) Field of Classification Search
USPC .......................................... 257/347, 350, 393
See application file for complete search history.

(56) References Cited

U.S. PATENT DOCUMENTS

| | | | |
|---|---|---|---|
| 6,690,072 B2 | 2/2004 | Cabral, Jr. et al. | |
| 7,300,837 B2* | 11/2007 | Chen et al. | 438/213 |
| 7,531,423 B2 | 5/2009 | Cheng et al. | |
| 7,736,984 B2 | 6/2010 | Grivna et al. | |
| 7,833,873 B2 | 11/2010 | Greene et al. | |
| 7,851,865 B2* | 12/2010 | Anderson et al. | 257/365 |
| 2005/0112817 A1 | 5/2005 | Cheng et al. | |

(Continued)

FOREIGN PATENT DOCUMENTS

EP 0451623 A2 10/1991

OTHER PUBLICATIONS

Basker, V.S., et al., "A 0.063 um2 FinFET SRAM Cell Demonstration with Conventional Lithography Using a Novel Integration Scheme with Agressively Scaled Fin and Gate Pitch," 2010 Symposium on VLSI Technology (VLSIT), Jun. 15-17, 2010, ISBN 978-1-4244-5451-8.

(Continued)

*Primary Examiner* — A. Sefer
(74) *Attorney, Agent, or Firm* — Stephen Bongini; Fleit Gibbons Gutman Bongini & Bianco PL (57) ABSTRACT

A finFET device is provided. The finFET device includes a BOX layer, fin structures located over the BOX layer, a gate stack located over the fin structures, gate spacers located on vertical sidewalls of the gate stack, an epi layer covering the fin structures, source and drain regions located in the semiconductor layers of the fin structures, and silicide regions abutting the source and drain regions. The fin structures each comprise a semiconductor layer and extend in a first direction, and the gate stack extends in a second direction that is perpendicular. The gate stack comprises a high-K dielectric layer and a metal gate, and the epi layer merges the fin structures together. The silicide regions each include a vertical portion located on the vertical sidewall of the source or drain region.

18 Claims, 7 Drawing Sheets

(56) References Cited

U.S. PATENT DOCUMENTS

| | | | |
|---|---|---|---|
| 2005/0148137 A1* | 7/2005 | Brask et al. ............... 438/216 |
| 2005/0202618 A1* | 9/2005 | Yagishita ................. 438/197 |
| 2007/0034972 A1* | 2/2007 | Chau et al. ............... 257/401 |
| 2008/0090397 A1* | 4/2008 | Brask et al. ............... 438/592 |
| 2008/0277742 A1* | 11/2008 | Hokazono ................. 257/401 |
| 2009/0206406 A1 | 8/2009 | Rachmady et al. |
| 2010/0155859 A1 | 6/2010 | Raaijmakers |
| 2010/0264497 A1* | 10/2010 | Chang et al. ............... 257/393 |
| 2010/0308379 A1 | 12/2010 | Kuan et al. |
| 2010/0327321 A1 | 12/2010 | Bhuwalka et al. |
| 2011/0001169 A1 | 1/2011 | Ozcan et al. |
| 2011/0027948 A1 | 2/2011 | Ren et al. |
| 2011/0042744 A1* | 2/2011 | Cheng et al. ............... 257/347 |
| 2011/0049583 A1* | 3/2011 | Lin et al. ............... 257/288 |
| 2011/0062518 A1 | 3/2011 | Chan et al. |
| 2011/0065244 A1* | 3/2011 | Chang et al. ............... 438/151 |
| 2011/0084314 A1 | 4/2011 | Or-Bach et al. |
| 2011/0133292 A1* | 6/2011 | Lee et al. ............... 257/401 |
| 2011/0193163 A1 | 8/2011 | Anderson et al. |
| 2011/0210393 A1 | 9/2011 | Chen et al. |
| 2011/0312141 A1 | 12/2011 | Liao et al. |

OTHER PUBLICATIONS

International Search Report and Written Opinion, dated Mar. 5, 2013, for PCT/US12/71579.

* cited by examiner

FINFET WITH MERGED FINS AND VERTICAL SILICIDE

FIELD OF THE INVENTION

The present invention generally relates to the field of semiconductors, and more particularly relates to fin field effect transistors (finFETs) with merged fins and vertical silicide.

BACKGROUND OF THE INVENTION

Fully-depleted devices such as fin field effect transistors (finFETs) are leading candidates to enable the scaling of gate lengths to 25 nm and below. However, one challenge in realizing finFETs is increased contact resistance. The contact resistance increases when the contact is made smaller. Thus, the contact resistance increases as gate-to-gate distance is scaled down to increase density (i.e., contacted gate pitch (CPP) scaling). A conventional finFET has 1.5 times the contact resistance of a planar device of the same area. Another challenge is a 3D penalty. A conventional finFET has a 3D penalty if only the top of the fin has silicide because the current has to travel vertically from bottom to top.

SUMMARY OF THE INVENTION

One embodiment of the present invention provides a finFET device. The finFET device includes a buried oxide (BOX) layer, multiple fin structures located over the BOX layer, and a gate stack located over the fin structures on the BOX layer. The fin structures each include a semiconductor layer and extend in a first direction, and the gate stack extends in a second direction that is perpendicular to the first direction. The gate stack includes a high-K dielectric layer and a metal gate. The finFET device further includes gate spacers located on vertical sidewalls of the gate stack, an epitaxial silicon (epi) layer covering the fin structures and merging the fin structures together, source and drain regions located in the semiconductor layers of the fin structures, and silicide regions abutting the source and drain regions. The silicide regions each include a vertical portion located on the vertical sidewall of the source or drain region.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION

Preferred embodiments of the present invention will be described in detail hereinbelow with reference to the attached drawings.

Embodiments of the present invention provide fin field effect transistors (finFETs) with merged fins (source and drain regions) and vertical silicide. The epitaxial silicon (epi) layer is recessed (or partially removed) prior to silicide formation, and then silicide is formed perpendicular to the channel direction. The finFET with this vertical silicide overcomes the problems discussed above because contact area is increased. Thus, the contact resistance is reduced when the gate-to-gate distance is scaled down to increase density (i.e., contacted gate pitch (CPP) scaling). In other words, the vertical silicide makes the contact resistance independent of the pitch. Also, there is no 3D penalty through current flow from bottom to top. And the epi layer merges the source and drain regions to provide reduced resistance and improved performance.

Figure 1:
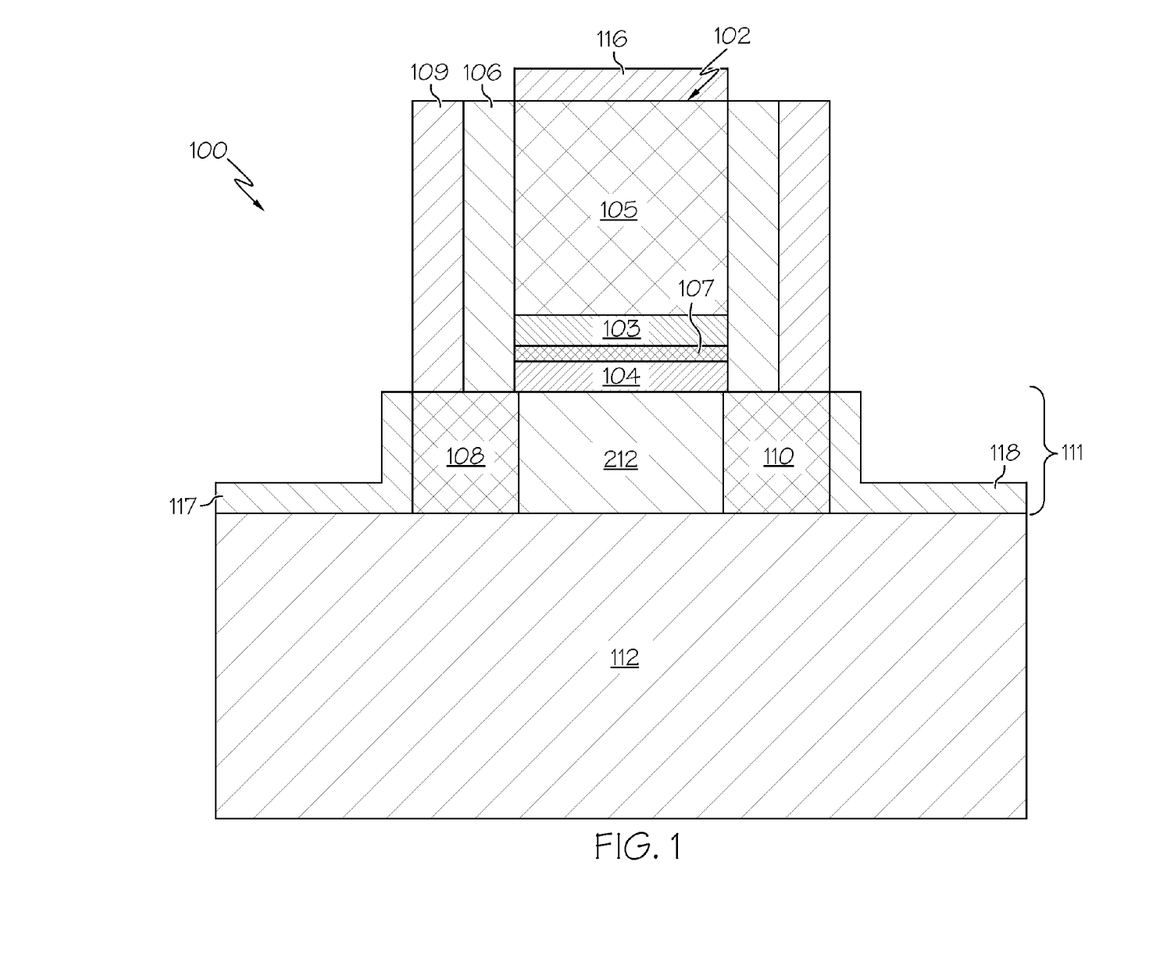
FIG. 1 is a cross-sectional view of a finFET device according to one embodiment of the present invention.

FIG. 1 shows a cross-sectional view of a finFET device (taken along line A-A of FIG. 11) according to one embodiment of the present invention. The finFET device 100 is formed on a silicon-on-insulator (SOI) substrate. The SOI substrate includes a semiconductor (e.g., silicon) layer 111 disposed on a buried oxide (BOX) layer 112, which is disposed on a semiconductor substrate. In another embodiment, the finFET device is formed on a bulk silicon substrate.

The finFET device 100 includes a gate stack 102 disposed on a hardmask 104 (i.e., dielectric). The gate stack 102 of this embodiment includes a polysilicon layer 105, a metal gate 103, and a high-K layer 107. The gate stack 102 is disposed on doped regions (N-type or P-type) of the silicon layer 111. The doped regions include a source region 108 and a drain region 110, with the gate stack 102 being located above a channel region 212 that is located between the source and drain regions 108 and 110. Gate spacers 106 are formed on the vertical sidewalls of the gate stack 102.

In this embodiment, the gate spacers 106 are formed of one or more layers of silicon nitride (SiN) and/or silicon oxide (SiO$_2$). Additionally, dummy spacers 109 are formed on the vertical sidewalls of the gate spacers 106. In this embodiment, the gate spacers 106 are formed of silicon nitride (SiN) or silicon oxide (SiO$_x$), and the dummy spacers 109 are formed of silicon dioxide (SiO$_2$). Silicide regions 117 and 118 include vertical portions located on the vertical sidewalls of the source and drain regions 108 and 110. Additionally, the silicide regions 117 and 118 include horizontal portions formed above the BOX layer 112.

Figure 2:
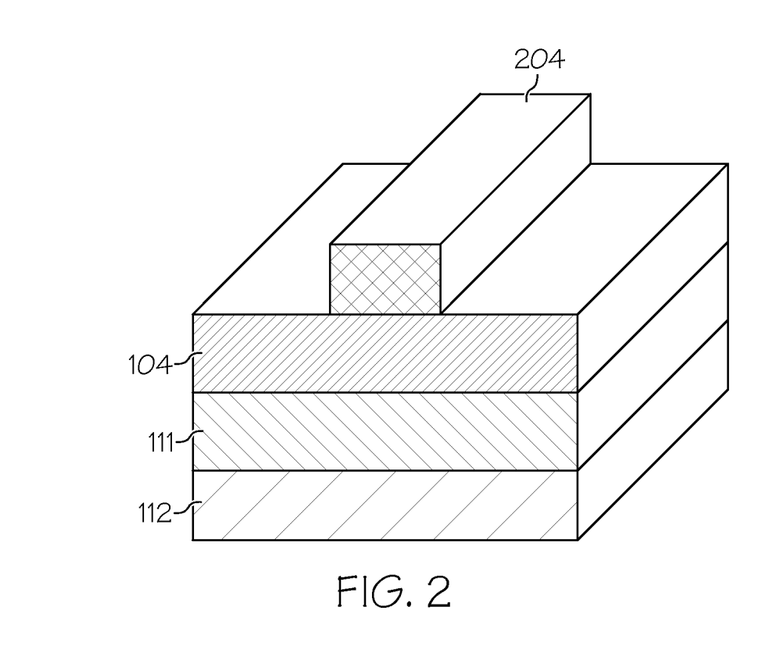
FIG. 2 illustrates a polysilicon structure formed above an SOI substrate during a process for fabricating a finFET device in accordance with a first embodiment of the present invention.
Figure 3:
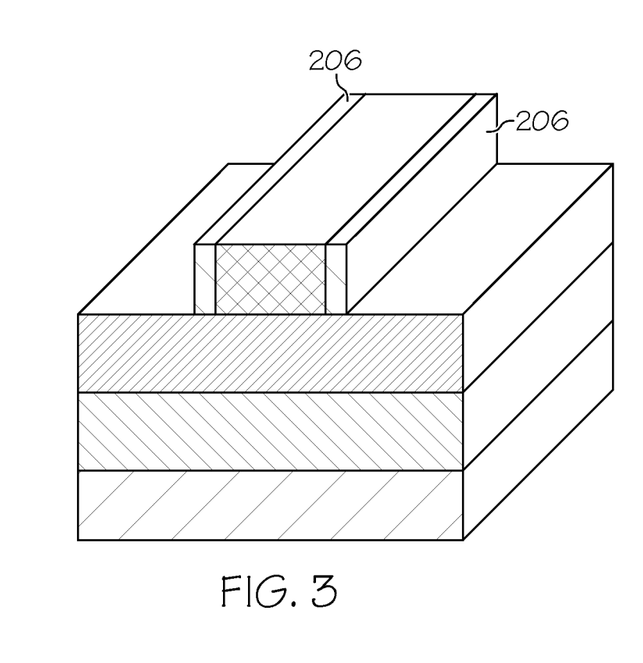
FIG. 3 illustrates silicon nitride structures formed on the sides of the polysilicon structure during the fabrication process of the first embodiment.

FIGS. 2-11 illustrate a process for fabricating the finFET device of FIG. 1 according to one embodiment of the present invention. The process begins with an SOI substrate that includes a silicon layer 111 disposed on a buried oxide (BOX) layer 112. As shown in FIG. 2, a hardmask (dielectric) layer 104 is formed on the silicon layer 111. The hard mask layer 104 of this embodiment is silicon dioxide ($SiO_2$) or silicon nitride (SiN). A polysilicon structure 204 is deposited on the hardmask layer 104 and then etched. As shown in FIG. 3, silicon nitride removable structures 206 are formed on the vertical sidewalls of the polysilicon structure 204 through a standard deposition and etching process.

Figure 4:
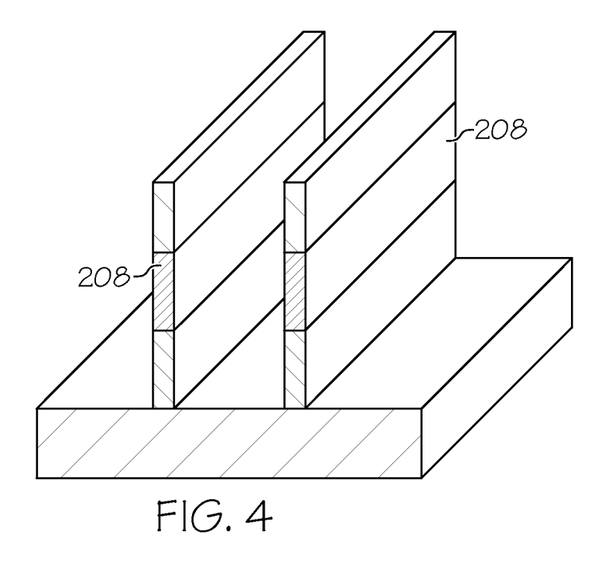
FIG. 4 illustrates the formation of fin structures during the fabrication process of the first embodiment.
Figure 5:
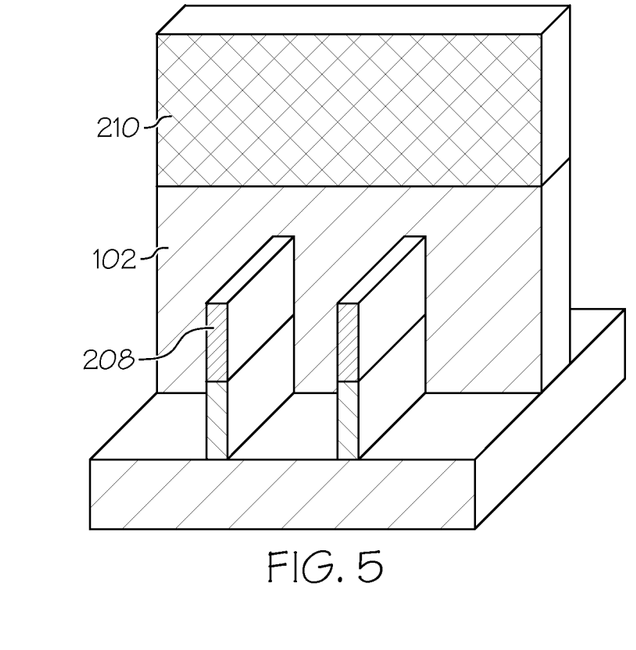
FIG. 5 illustrates formation of a gate stack perpendicular to the fin structures during the fabrication process of the first embodiment.
Figure 6:
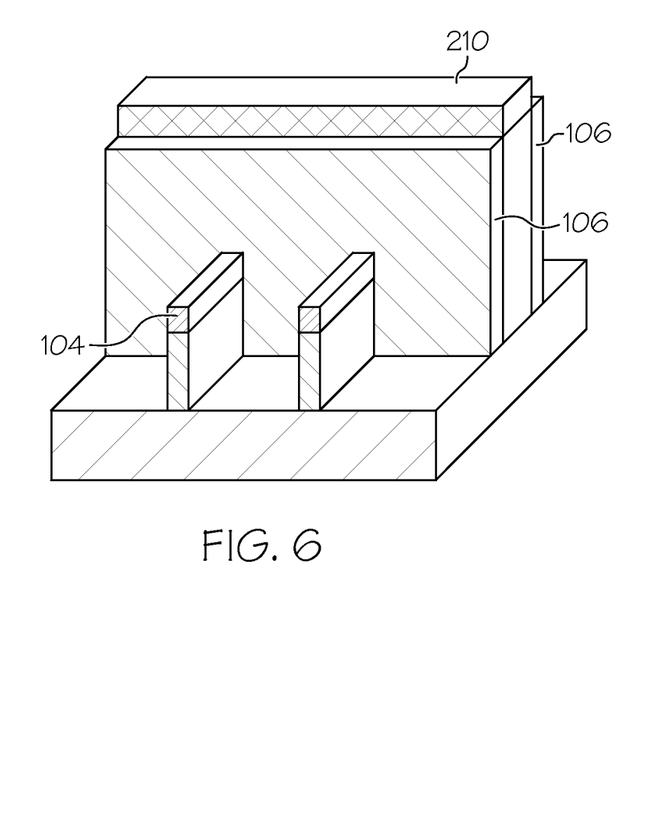
FIG. 6 illustrates gate spacers formed along the sides of the gate stack during the fabrication process of the first embodiment.

As shown in FIG. 4, the polysilicon structure 204 is removed, and the hardmask and silicon layers 104 and 111 are etched to form fin structures 208. The removable structures 206 are then removed, as shown in FIG. 5. This produces fin structures 208 that are formed by the portions of the hardmask layer 104 and silicon layer 111 that were located under the removable structures 206. A gate stack 102 is formed on the BOX layer 112 perpendicular to the fin structures 208, and an SiN layer 210 is formed on the gate stack 102. The gate stack 102 of this embodiment includes a polysilicon layer, a metal gate, and a high-K layer (e.g., $HfO_2$). As shown in FIG. 6, upper portions of the hardmask layer 104 and the SiN layer 210 are removed. Gate spacers 106 are formed along the vertical sidewalls of the gate stack 102.

Figure 7:
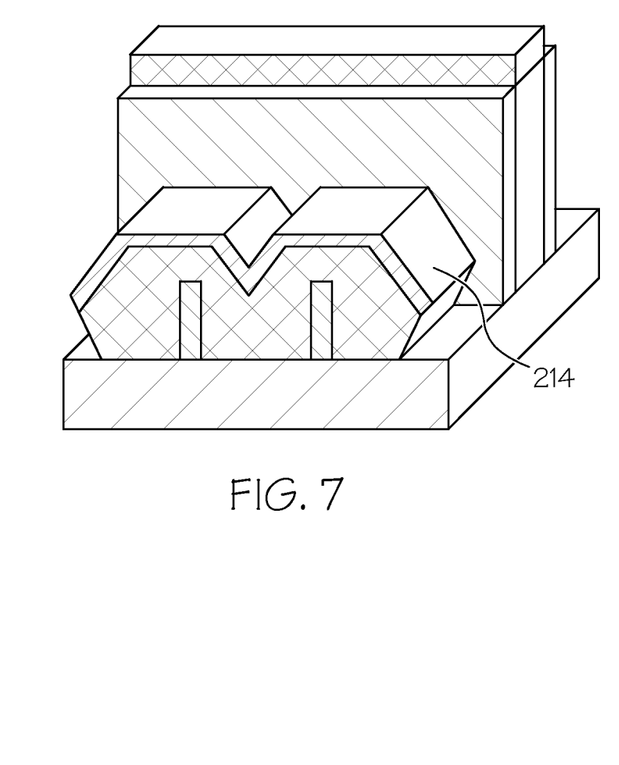
FIG. 7 illustrates an epitaxial silicon layer deposited over the fin structures during the fabrication process of the first embodiment.
Figure 8:
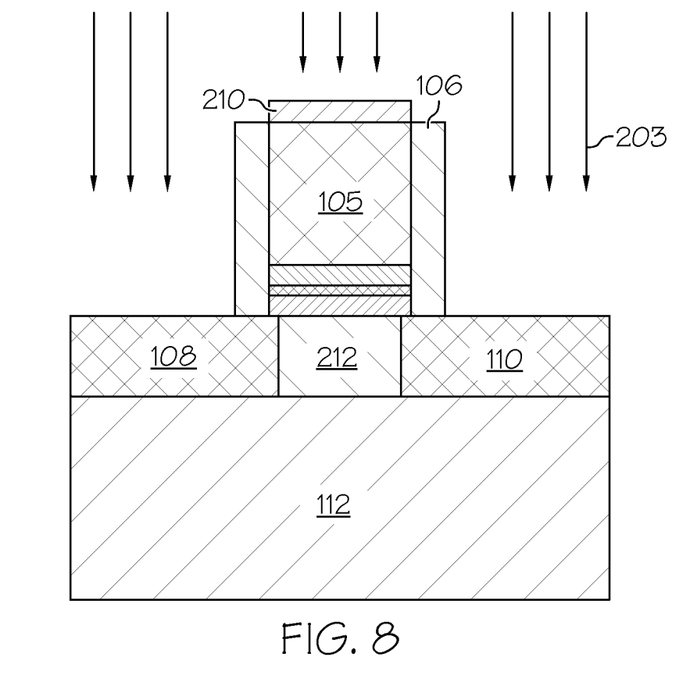
FIG. 8 illustrates implantation of ions to form source and drain regions during the fabrication process of the first embodiment.
Figure 9:
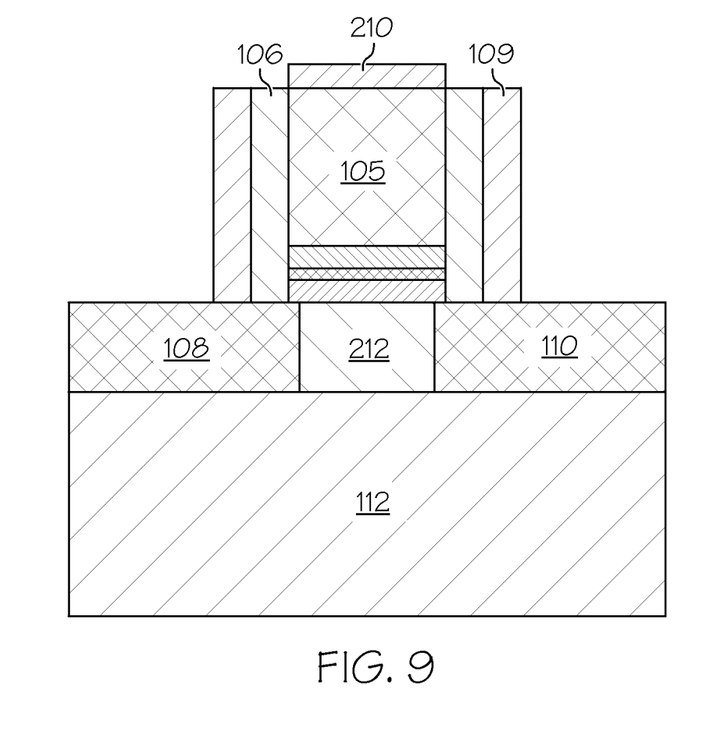
FIG. 9 illustrates dummy spacer formed on the sides of the gate spacers during the fabrication process of the first embodiment.

An epitaxial silicon (epi) layer 214 is then deposited over the fin structures 208, as shown in FIG. 7. In the illustrated embodiment, the epi layer is an in-situ doped epitaxial film. The in-situ doped films enable uniform junction formation, which results in a reduction in resistance. The epi layer 214 creates uniform extensions on the fins so as to merge the individual fin structures 208 together. The epi layer provides conformal doping of the devices, reduce the resistance, and significantly improve performance. Ions 203 are then implanted into the silicon layer 111 to form source and drain regions, as shown in FIG. 8. (FIGS. 1, 8-10, and 12 show a cross-sectional view of the finFET device taken along a line running through the center of one of the fin structures). The result of epi formation and ion implantation is a finFET device with merged source and drain regions 108 and 110. A channel region 212 is located between the source and drain regions 108 and 110. Next, dummy spacers 109 are formed on the vertical sidewalls of the gate spacers 106, as shown in FIG. 9. In this embodiment, the dummy spacers 109 are formed by silicon dioxide ($SiO_2$).

Figure 10:
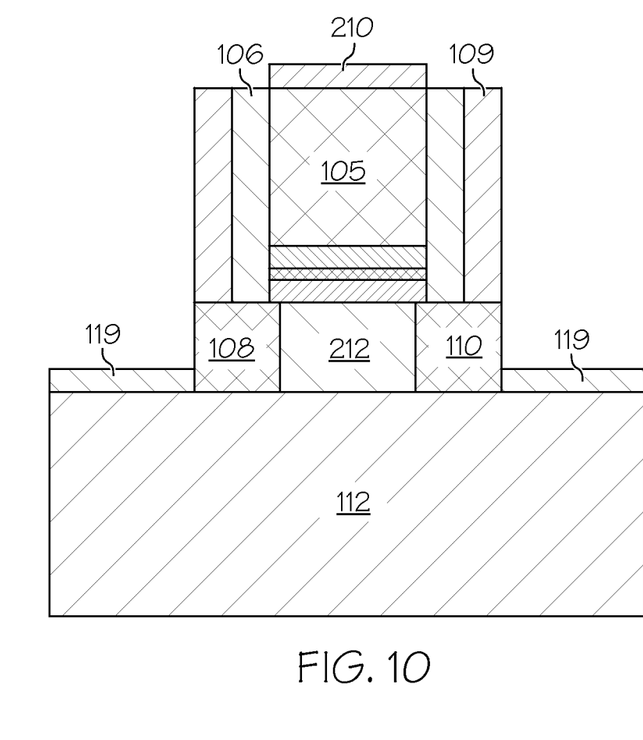
FIG. 10 illustrates formation of a recessed epi layer during the fabrication process of the first embodiment.

An etch is then performed using the dummy spacers 109 as a mask. This removes a portion of the epi layer so as to form a recessed epi layer 119, as shown in FIG. 10. In this embodiment, the epi layer is originally 30-50 nm thick, and is then etched to produce a recessed epi layer 119 that is 10-15 nm thick. In one embodiment, about half of the thickness of the epi layer is removed. In general, the thickness of the recessed epi layer 119 is selected so as to subsequently produce horizontal silicide of an adequate thickness, while being thin enough to allow the horizontal silicide to reach the BOX layer 112.

Figure 11:
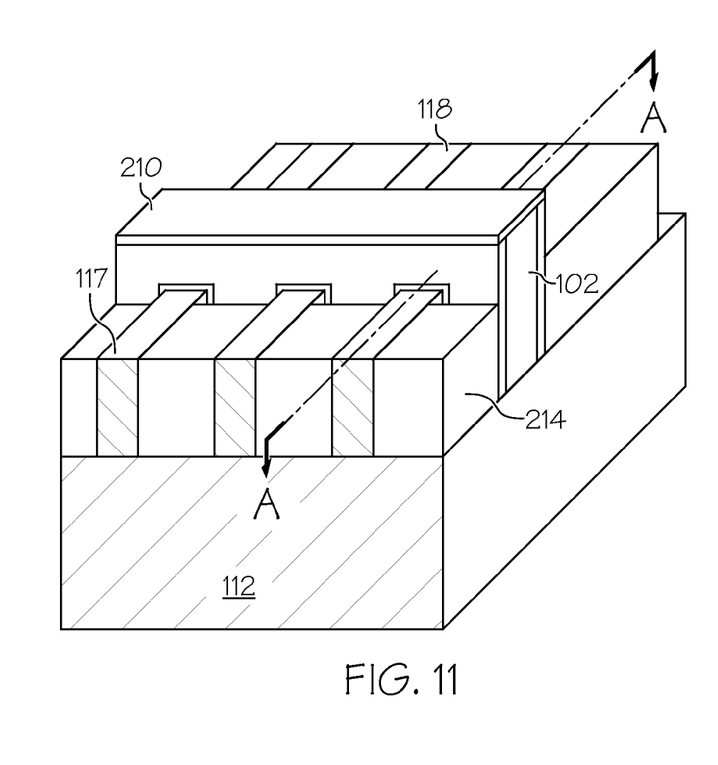
FIG. 11 illustrates formation of silicide regions during the process of the first embodiment.

Next, silicidation is performed. As shown in FIGS. 1 and 11, this forms a silicide layer 116 over the gate stack 102, and silicide regions 117 and 118 that abut the source and drain regions 108 and 110 from the side. The silicide regions 117 and 118 each include a vertical portion located on the vertical sidewall of the source or drain region, and a horizontal portion formed above the BOX layer 112. In the illustrated embodiment, a nickel silicide is formed. In further embodiments, the silicide is formed using nickel, titanium, cobalt, or a combination or alloy thereof. Optionally, the dummy spacers 109 are removed after silicidation. Then, contacts are formed on the silicide regions and metal lines are formed in a conventional manner to complete the device.

Figure 12:
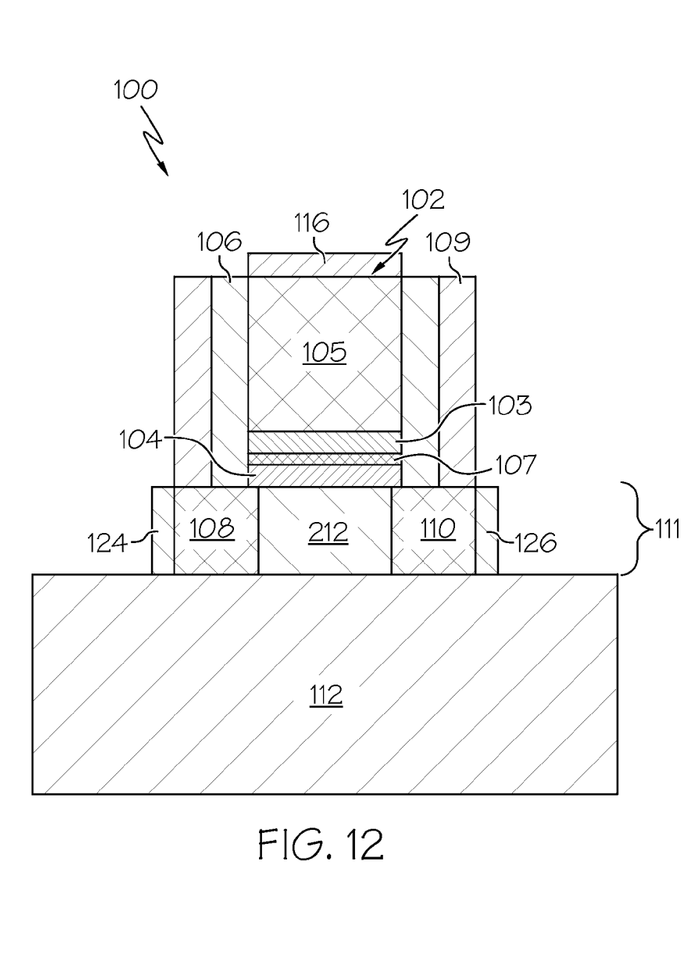
FIG. 12 is a cross-sectional view of a finFET device according to another embodiment of the present invention.

FIG. 12 shows a cross-sectional view of a finFET device according to one embodiment of the present invention. In this alternative embodiment, the silicide regions for the source and drain do not include horizontal portions. More specifically, when performing the etch of the epi layer using the dummy spacers 109 as a mask, the entire thickness of the epi layer is removed in the exposed areas. Then, silicidation is performed to form a silicide layer 116 over the gate stack 102, and silicide regions 124 and 126 that abut the source and drain regions 108 and 110 from the side.

As shown in FIG. 12, the silicide regions 124 and 126 each include a vertical portion located on the vertical sidewall of the source or drain region, but do not include the horizontal portion of the previous embodiment. In various embodiments, the silicide is formed using nickel, titanium, cobalt, or a combination or alloy thereof. Optionally, the dummy spacers 109 are removed after silicidation. Then, contacts are formed on the silicide regions and metal lines are formed in a conventional manner to complete the device.

Accordingly, embodiments of the present invention provide a finFET device with merged source and drain regions (fins) and vertical silicide on the source and drain regions. The epi layer is recessed (or partially removed) prior to silicide formation, and then silicide is formed perpendicular to the channel direction. This vertical silicide increases the contact area while reducing the spreading distance. Thus, the contact resistance is reduced when the gate-to-gate distance is scaled down to increase density (i.e., contacted gate pitch (CPP) scaling). In other words, the vertical silicide makes the contact resistance independent of the pitch.

Also, there is no 3D penalty through current flow from bottom to top. Further, the vertical silicide is self-aligned through the use of a dummy spacer to etch the epi layer. The dummy spacer is formed after the source/drain implantation in order to prevent silicide encroachment. And the epi layer merges the source and drain regions to provide reduced resistance and improved performance.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A finFET device comprising:
    a buried oxide (BOX) layer;
    a plurality of fin structures located over the BOX layer, the fin structures each comprising a semiconductor layer and extending in a first direction;
    a gate stack located over the fin structures on the BOX layer, the gate stack extending in a second direction that is perpendicular to the first direction, the gate stack comprising a high-K dielectric layer and a metal gate;
    gate spacers located on vertical sidewalls of the gate stack;
    an epitaxial silicon (epi) layer covering the fin structures, the epi layer merging the fin structures together;
    source and drain regions located in the semiconductor layers of the fin structures;
    silicide regions abutting the source and drain regions; and
    dummy spacers located on vertical sidewalls of the gate spacers, the vertical sidewall of each source and drain region being aligned with a vertical sidewall of one of the dummy spacers,
    wherein at least one of the silicide regions includes a vertical portion located on the vertical sidewall of the source or drain region, and a horizontal portion formed above the BOX layer and extending from the vertical portion in the first direction.

2. The finFET device of claim 1, wherein the horizontal portions of the silicide regions are about 10-15 nm thick.

3. The finFET device of claim 1, wherein a lower surface of the horizontal portion of the silicide regions is in direct contact with the BOX layer.

4. The finFET device of claim 1, wherein each of the silicide regions includes a vertical portion located on the vertical sidewall of the source or drain region, and a horizontal portion formed above the BOX layer and extending from the vertical portion in the first direction.

5. The finFET device of claim 1, wherein a thickness of the vertical portion of the at least one silicide region is greater than a thickness of the horizontal portion of the at least one silicide region.

6. The finFET device of claim 1, wherein a top surface of the vertical portion of the at least one silicide region is above a top surface of the horizontal portion of the at least one silicide region.

7. The finFET device of claim 1, wherein a thickness of the semiconductor layers of the fin structures is greater than the thickness of the horizontal portion of the at least one silicide region.

8. The finFET device of claim 1, wherein the horizontal and vertical portions of the at least one silicide region form an "L" shape.

9. An integrated circuit comprising a plurality of finFET devices, at least one of the finFET devices comprising:
    a buried oxide (BOX) layer;
    a plurality of fin structures located over the buried oxide (BOX) layer, the fin structures each comprising a semiconductor layer and extending in a first direction;
    a gate stack located over the fin structures on the BOX layer, the gate stack extending in a second direction that is perpendicular to the first direction, the gate stack comprising a high-K dielectric layer and a metal gate;
    gate spacers located on vertical sidewalls of the gate stack;
    an epitaxial silicon (epi) layer covering the fin structures, the epi layer merging the fin structures together;
    source and drain regions located in the semiconductor layers of the fin structures;
    silicide regions abutting the source and drain regions; and
    dummy spacers located on vertical sidewalls of the gate spacers, the vertical sidewall of each source and drain region being aligned with a vertical sidewall of one of the dummy spacers,
    wherein the silicide regions each include a vertical portion located on the vertical sidewall of the source or drain region, and a horizontal portion formed above the BOX layer and extending from the vertical portion in the first direction.

10. The integrated circuit of claim 9, wherein the horizontal portions of the silicide regions are about 10-15 nm thick.

11. The integrated circuit of claim 9, wherein a lower surface of the horizontal portion of the silicide regions is in direct contact with the BOX layer.

12. The integrated circuit of claim 9, wherein the at least one finFET device further comprises a contact on each of the silicide regions.

13. The integrated circuit of claim 9,
wherein the fin structures each comprise a dielectric layer above the semiconductor layer, and
the semiconductor layer is a silicon layer.

14. A finFET device comprising:
a buried oxide (BOX) layer;
a plurality of fin structures located over the BOX layer, the fin structures each comprising a semiconductor layer and extending in a first direction;
a gate stack located over the fin structures on the BOX layer, the gate stack extending in a second direction that is perpendicular to the first direction, the gate stack comprising a high-K dielectric layer and a metal gate;
gate spacers located on vertical sidewalls of the gate stack;
an epitaxial silicon (epi) layer covering the fin structures, the epi layer merging the fin structures together;
source and drain regions located in the semiconductor layers of the fin structures;
silicide regions abutting the source and drain regions, the silicide regions each including a vertical portion located on the vertical sidewall of the source or drain region; and
dummy spacers located on vertical sidewalls of the gate spacers, the vertical sidewall of each source and drain region being aligned with a vertical sidewall of one of the dummy spacers.

15. The finFET device of claim 14, further comprising a contact on each of the silicide regions.

16. The finFET device of claim 14,
wherein the fin structures each comprise a dielectric layer above the semiconductor layer, and
the semiconductor layer is a silicon layer.

17. The finFET device of claim 14, wherein the silicide regions each also include a horizontal portion formed above the BOX layer and extending from the vertical portion in the first direction.

18. The finFET device of claim 17, wherein a lower surface of the horizontal portion of the silicide regions is in direct contact with the BOX layer.

* * * * *